United States Patent
De La Cruz et al.

(10) Patent No.: US 7,342,846 B2
(45) Date of Patent: Mar. 11, 2008

(54) ADDRESS DECODING SYSTEMS AND METHODS

(75) Inventors: Louis De La Cruz, Pflugerville, TX (US); Allen R. White, Austin, TX (US); Hemanshu T. Vernenker, Austin, TX (US)

(73) Assignee: Lattice Semiconductor Corporation, Hillsboro, OR (US)

(*) Notice: Subject to any disclaimer, the term of this patent is extended or adjusted under 35 U.S.C. 154(b) by 38 days.

(21) Appl. No.: 11/187,179

(22) Filed: Jul. 22, 2005

(65) Prior Publication Data

US 2007/0019495 A1 Jan. 25, 2007

(51) Int. Cl.
 *G11C 8/00* (2006.01)
(52) U.S. Cl. ............... 365/230.06; 365/230.08; 365/194; 365/233
(58) Field of Classification Search .......... 365/230.06, 365/230.08, 194, 233
See application file for complete search history.

(56) References Cited

U.S. PATENT DOCUMENTS

| | | | |
|---|---|---|---|
| 4,160,291 A * | 7/1979 | Smith et al. ............. | 365/203 |
| 5,022,010 A * | 6/1991 | Chan ................... | 365/230.06 |
| 5,068,881 A * | 11/1991 | Dervisoglu et al. ........ | 377/70 |
| 6,198,650 B1 * | 3/2001 | Suh ..................... | 365/63 |
| 6,998,878 B2 * | 2/2006 | Kanetani et al. .......... | 326/112 |

\* cited by examiner

*Primary Examiner*—Richard T. Elms
*Assistant Examiner*—Eric Wendler
(74) *Attorney, Agent, or Firm*—MacPherson Kwok Chen & Heid LLP; Greg J. Michelson

(57) ABSTRACT

Systems and methods provide improved address decoding techniques for memory. For example, in accordance with an embodiment of the present invention, an integrated circuit includes an address register that receives a reset signal, a clock signal, and an address signal and provides a registered address signal. The registered address signal provides at least a true and a complement signal, with the true and complement signal set to approximately the same logical value upon assertion of the reset signal. An address pre-decoder, coupled to the address register, at least partially decodes the registered address signal to provide a pre-decoded output signal. A wordline driver, coupled to the address pre-decoder, receives a wordline enable signal and the pre-decoded output signal and provides a wordline signal based on the pre-decoded output signal upon assertion of the wordline enable signal.

18 Claims, 11 Drawing Sheets

US 7,342,846 B2

ADDRESS DECODING SYSTEMS AND METHODS

TECHNICAL FIELD

The present invention relates generally to electrical circuits and, more particularly, to address decoding schemes.

BACKGROUND

Memory is employed in a wide variety of integrated circuit applications and may be implemented, for example, as discrete memory or as embedded memory (e.g., with a processor and/or within a programmable logic device). One drawback of a conventional memory, for example, is that during the decoding of an address (e.g., for a dynamic wordline driver), multiple wordlines may be erroneously activated if the setup time is violated for the address decoding (e.g., address pre-decoding) and wordline enable signals. This error may occur, for example, due to the typical address pre-decoder having one output signal always high. Consequently, removing the old address signal may become as critical for timing purposes as providing the new address signal.

Typically, a delay path is employed to prevent the wordline-enable signal from activating too soon. However, in order to meet the setup time for the worst-case path (i.e., worst-case corner), the length of the delay is generally excessive for the typical path (e.g., to the other corners). The excessive delay generally results in lower performance for the memory, especially for the typical path (e.g., to the non-worst case corners). As a result, there is a need for improved memory techniques.

SUMMARY

In accordance with one embodiment of the present invention, an integrated circuit includes an address register adapted to receive a reset signal, a clock signal, and an address signal and provide a registered address signal, wherein the registered address signal provides at least a true and a complement signal, with the true and complement signal set to approximately the same logical value upon assertion of the reset signal; an address pre-decoder, coupled to the address register, adapted to partially decode the registered address signal to provide a pre-decoded output signal; and a wordline driver, coupled to the address pre-decoder, adapted to receive a wordline enable signal and the pre-decoded output signal and provide a wordline signal based on the pre-decoded output signal upon assertion of the wordline enable signal.

In accordance with another embodiment of the present invention, an integrated circuit includes means for receiving an address signal and providing a registered address signal, wherein the registered address signal is a dual rail signal; means for decoding the registered address signal; a memory array; and means for activating a wordline within the memory array based on the decoding of the registered address signal.

In accordance with another embodiment of the present invention, a method of activating a wordline for a memory includes receiving an address signal; providing a dual rail address signal based on the address signal; decoding the dual rail address signal; and activating a wordline within a memory based on the decoding of the dual rail address signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
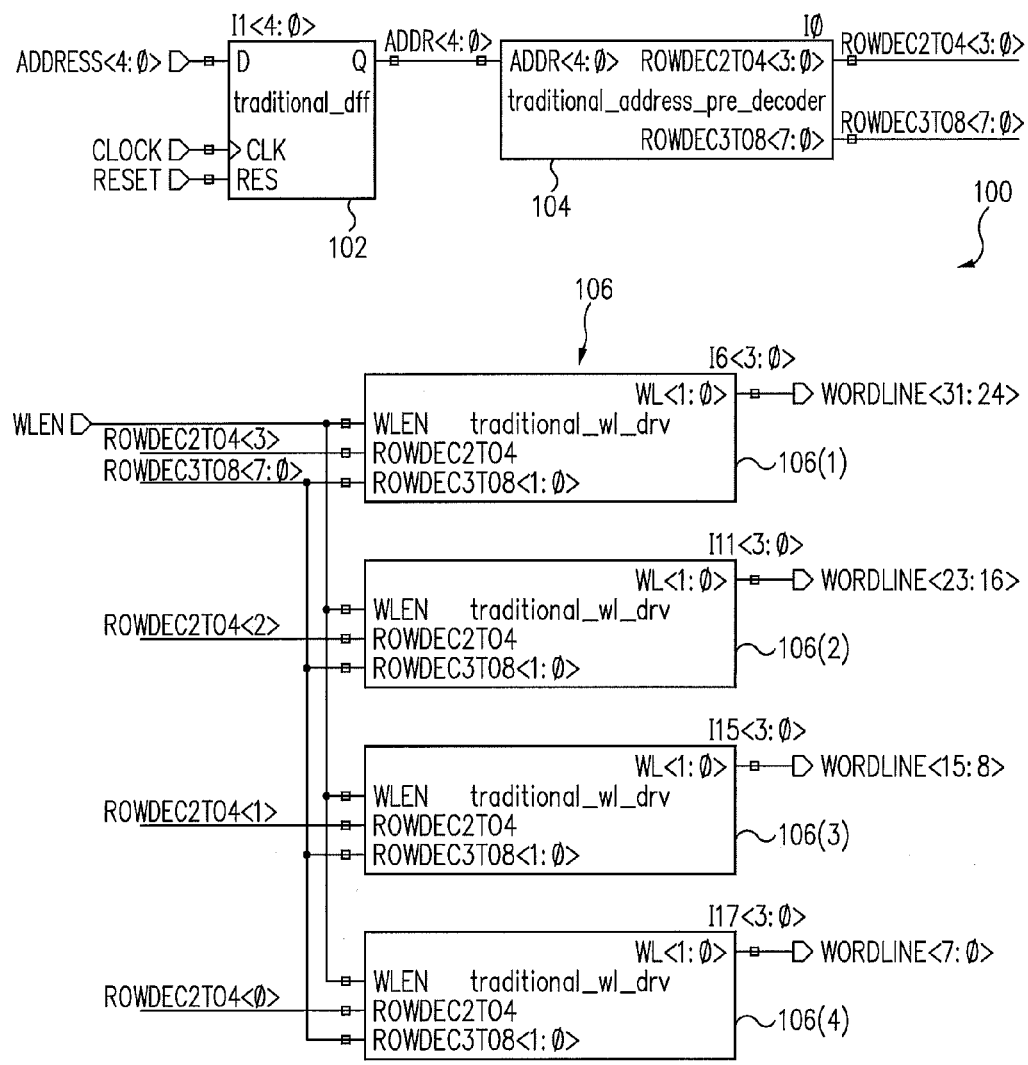
FIG. 1 shows a block diagram illustrating a portion of a typical memory.

FIG. 1 shows a block diagram illustrating a portion of a typical memory 100 (e.g., a conventional address decoder), which includes address registers 102, an address pre-decoder 104, and wordline drivers 106. Address registers 102 receive a clock signal, a reset signal, and an address signal (e.g., a five-bit address signal labeled ADDRESS<4:0>) and provide the registered address signal (ADDR<4:0>) to address pre-decoder 104.

Address pre-decoder 104 reduces the decoding complexity by using several decoders, with each decoding a subset of the address signal, to provide output signals (labeled ROWDEC2TO4<3:0> and ROWDEC3TO8<7:0>). Wordline drivers 106 decode the output signals from address pre-decoder 104 and provide the appropriate wordline (e.g., one of WORDLINES<31:0>) upon assertion of a wordline enable (WLEN) signal. Wordline drivers 106 are shown in an exemplary fashion as wordline drivers 106(1) through 106(4), which provide corresponding WORDLINES<31: 24>, WORDLINES<23:16>, WORDLINES<15:8>, and WORDLINES<7:0>.

Figure 2:
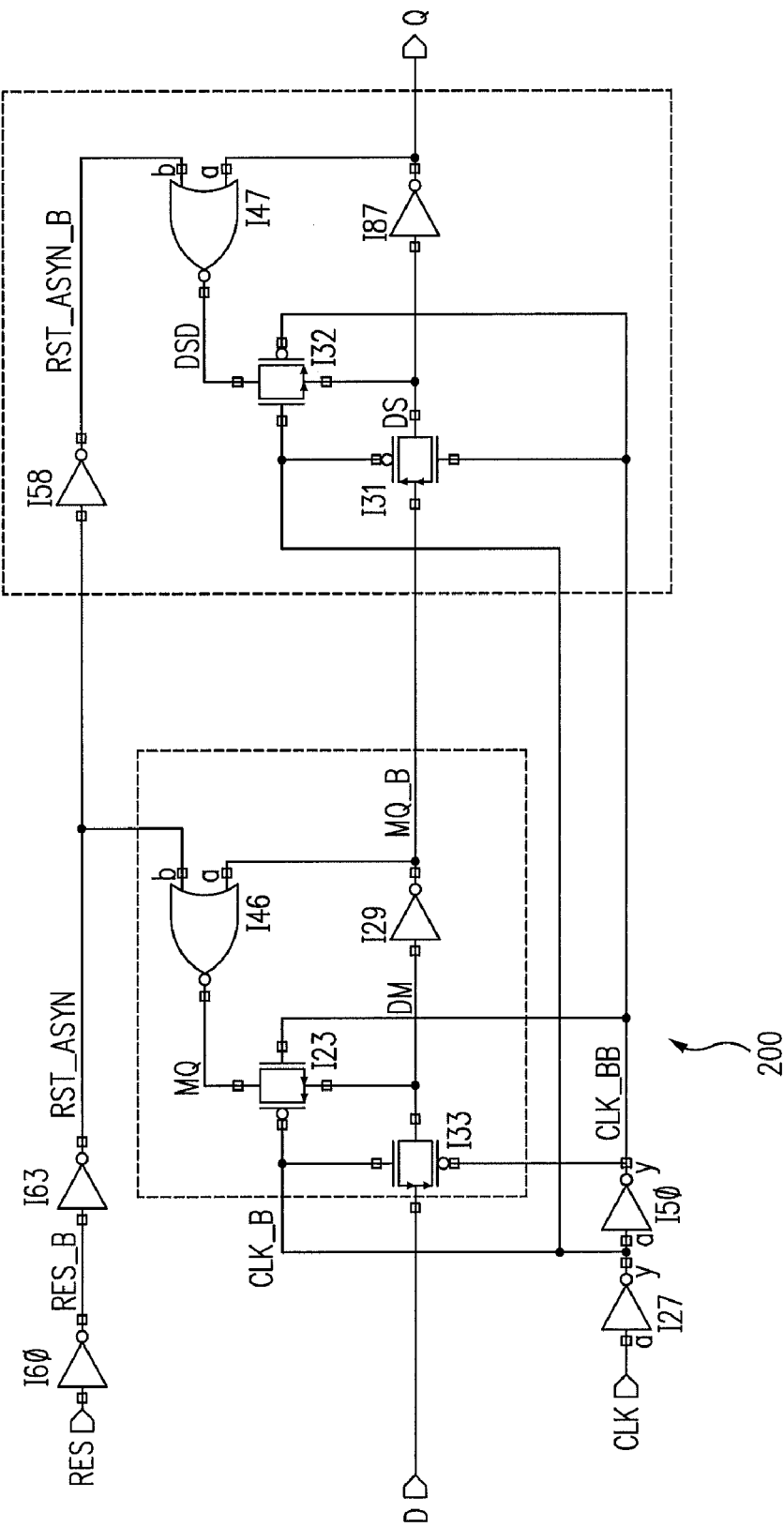
FIG. 2 shows a block diagram illustrating an exemplary circuit implementation for a portion of the memory of FIG. 1.
Figure 3:
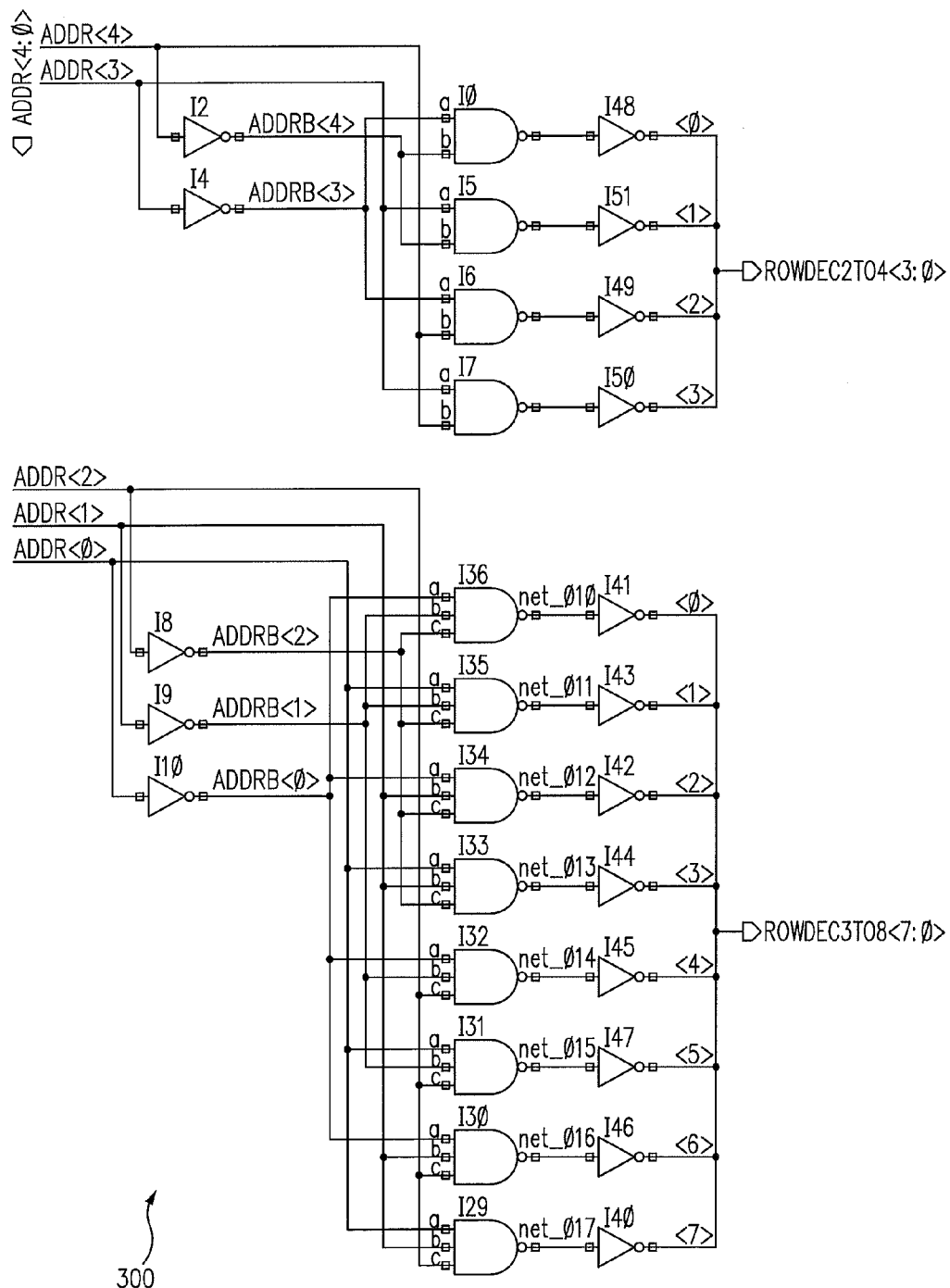
FIG. 3 shows a block diagram illustrating an exemplary circuit implementation for a portion of the memory of FIG. 1.
Figure 4:
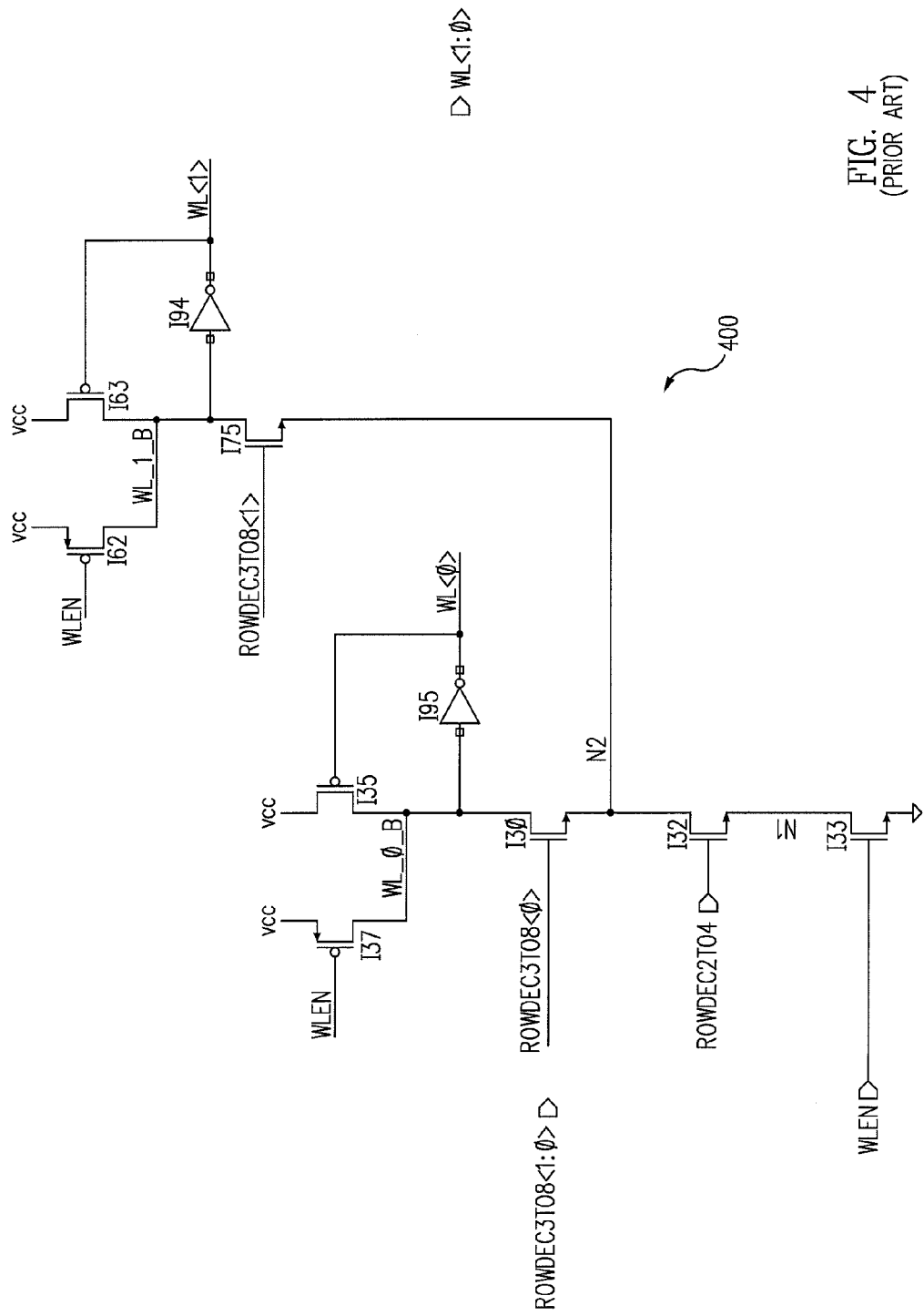
FIG. 4 shows a block diagram illustrating an exemplary circuit implementation for a portion of the memory of FIG. 1.

FIGS. 2-4 show exemplary circuit implementations for portions of memory 100 (FIG. 1). Specifically, FIG. 2 shows a circuit 200, which is an exemplary circuit implementation for one of the registers within address registers 102 of memory 100. FIG. 3 shows a circuit 300, which is an exemplary circuit implementation for address pre-decoder 104 of memory 100. FIG. 4 shows a circuit 400, which is an exemplary circuit implementation for some of the drivers (e.g., wordline drivers providing WORDLINE<1:0> or referred to as WL<1> and WL<0>) within wordline drivers 106.

Figure 5:
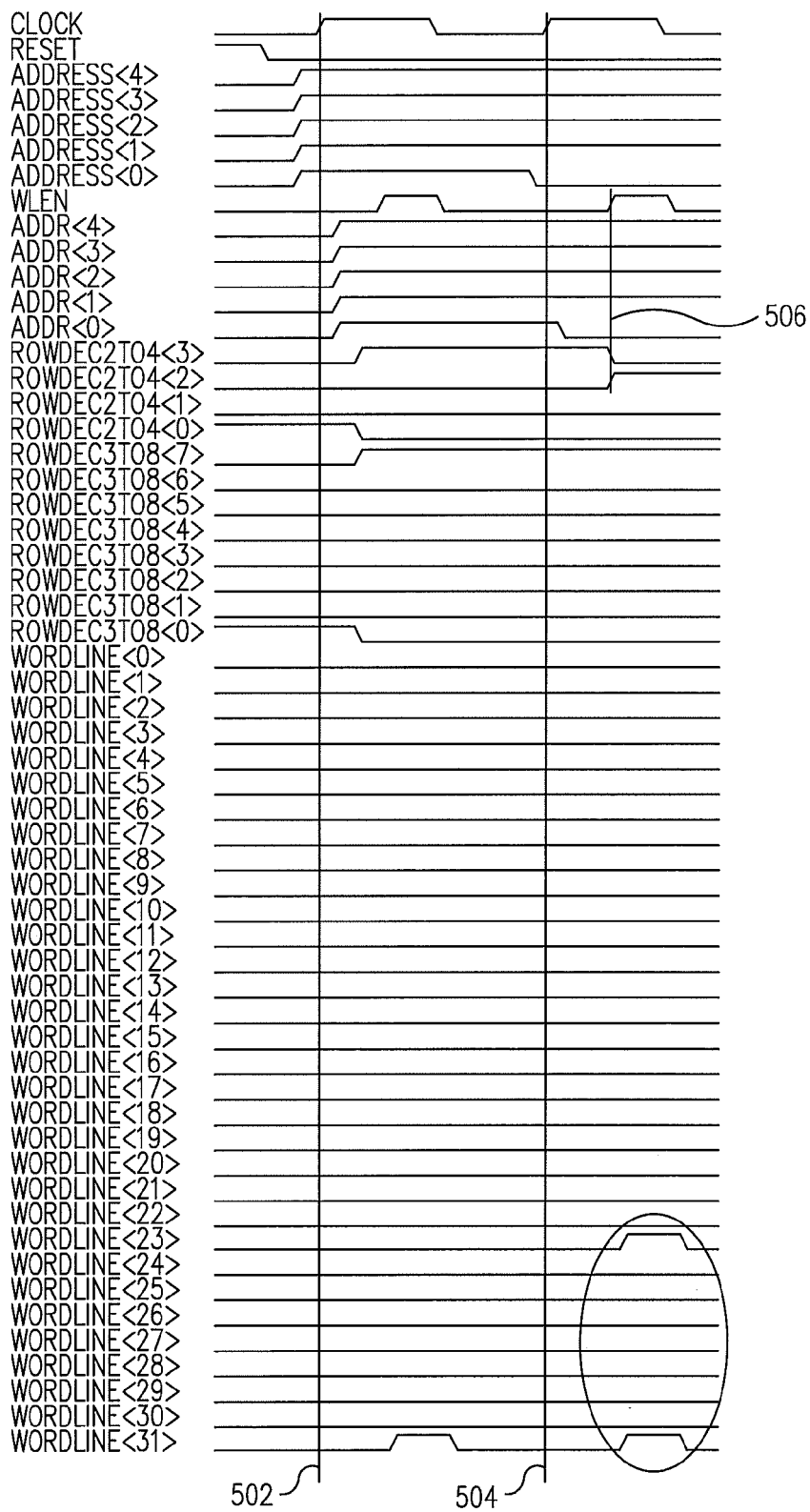
FIG. 5 shows a timing diagram illustrating an exemplary timing scenario for the memory of FIG. 1.

FIG. 5 shows a timing diagram illustrating an exemplary timing scenario for memory 100 of FIG. 1. As shown in FIG. 5, a normal sequence of events (e.g., around a vertical line 502) includes address registers being reset, with a new address (as shown by ADDRESS<4:0> signals) provided to address registers 102 prior to a rising edge of the clock signal (at vertical line 502). The new address is clocked into address registers 102 and propagated through address pre-decoder 104 to wordline drivers 106, as shown in FIG. 5.

The old address must meet the setup time of the wordline enable (WLEN) signal to prevent the erroneous enabling of one or more of the output signals from address pre-decoder 104 (e.g., ROWDEC2TO4<0> and ROWDEC3TO8<0>). The assertion of the wordline enable (WLEN) signal and the new address allow the correct wordline (e.g., WORDLINE<31>) to be activated, with the wordline enable (WLEN) signal deasserted to end the cycle and start the pre-charge of the bitlines.

The next cycle begins (e.g., around a vertical line 504) with a new address (as shown by ADDRESS<4:0> signals) provided to address registers 102 prior to a rising edge of the clock signal (at vertical line 504). However, in this example, the old address is slow to clear from address pre-decoder 104, as shown by the output signal (ROWDEC2TO4<3>) at a vertical line 506. Consequently, two wordlines (WORDLINE<23> and WORDLINE<31>) are erroneously activated at approximately the same time rather than only one as desired.

Figure 6:
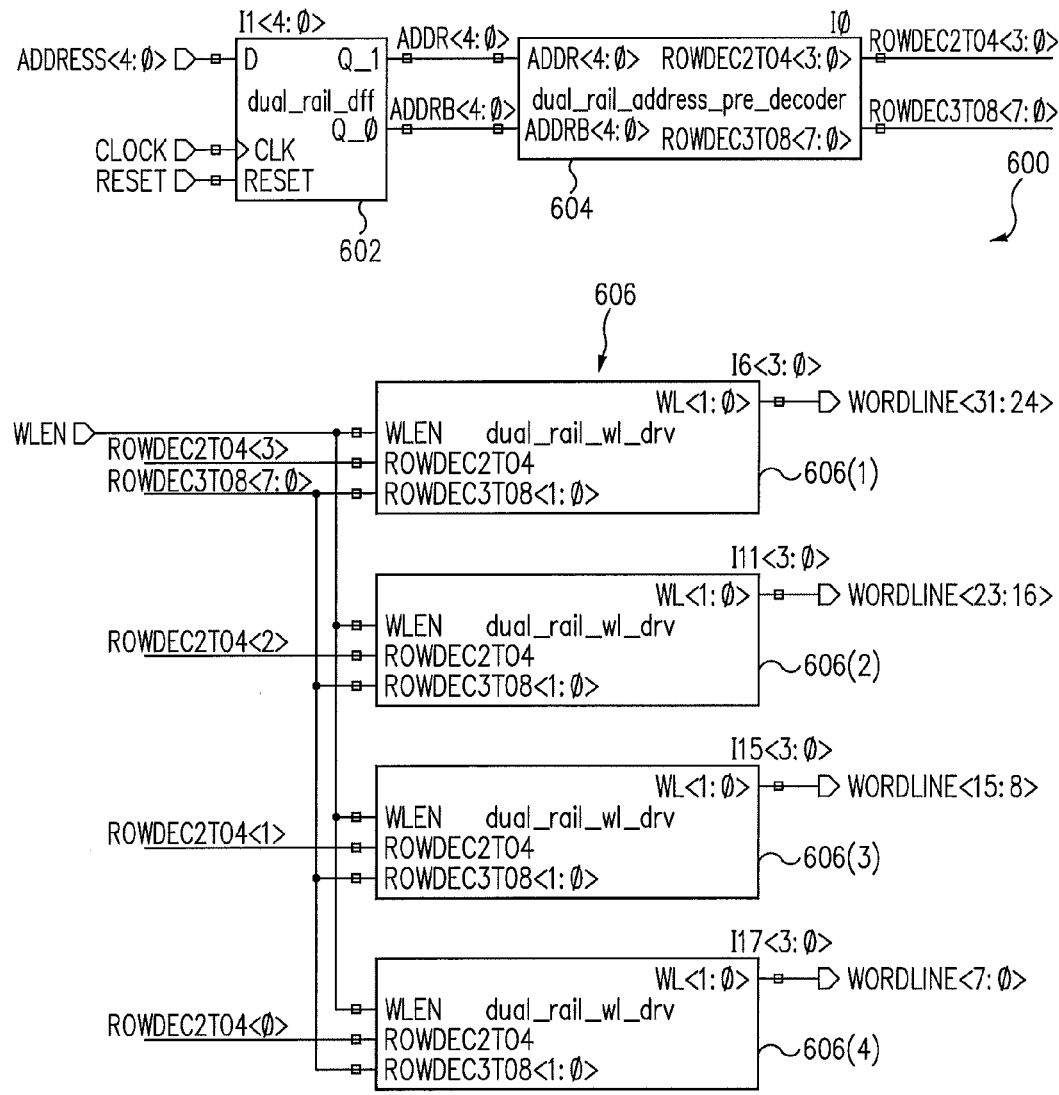
FIG. 6 shows a block diagram illustrating a portion of a memory in accordance with an embodiment of the present invention.

FIG. 6 shows a block diagram illustrating a portion of a memory 600 (e.g., an address decoder) in accordance with an embodiment of the present invention, which includes address registers 602, an address pre-decoder 604, and wordline drivers 606. Memory 600 differs from memory 100 (FIG. 1), as an example, by providing a dual rail address decoder.

A dual rail address decoder, in accordance with an embodiment of the present invention, has separate input terminals (e.g., at address pre-decoder 604) for one or more address bits and their inverse (e.g., address bit_0 and address bit_0_B, respectively). Furthermore, instead of the address bit and its inverse always being complementary (i.e., address bit_0_B being the inverse of address bit_0, with one of the signals always high and the other low), the dual rail address decoder allows both signals to be set to approximately the same value (e.g., a logical low) at the same time (e.g., during a reset).

Thus, in addition to allowing one of the signals to be high while the other is low (e.g., depending upon an input signal being high or low), the signals may also be set to approximately the same logical value. As explained further herein, this allows all of the output signals of address pre-decoder 604 to be brought to approximately the same signal level (e.g., low) before the next address is decoded, which eliminates the possibility of erroneously activating more than one wordline at a time as was shown for a conventional address decoder (e.g., in reference to FIG. 5).

Address registers 602 receive the clock signal, the reset signal, and the address signal (e.g., a five-bit address signal labeled ADDRESS<4:0>) in a similar fashion as address registers 102 (FIG. 1). However, address registers 602 are dual rail address registers that provide the registered address signal (ADDR<4:0>) and its complement (ADDRB<4:0>) to address pre-decoder 604, but may also provide approximately the same logical value at approximately the same time for the registered address signal and its complement (e.g., as described further in reference to FIG. 7). Thus, address registers 602 provide dual rail signals to address pre-decoder 604.

Address pre-decoder 604 reduces the decoding complexity by using several decoders, with each decoding a subset of the address signal, to provide the output signals (labeled ROWDEC2TO4<3:0> and ROWDEC3TO8<7:0>). Wordline drivers 606 decode the output signals from address pre-decoder 604 and provide the appropriate wordline (e.g., one of WORDLINES<31:0>) upon assertion of a wordline enable (WLEN) signal. Wordline drivers 606 are shown in an exemplary fashion as wordline drivers 606(1) through 606(4), which provide corresponding WORDLINES<31: 24>, WORDLINES<23:16>, WORDLINES<15:8>, and WORDLINES<7:0>.

Figure 7:
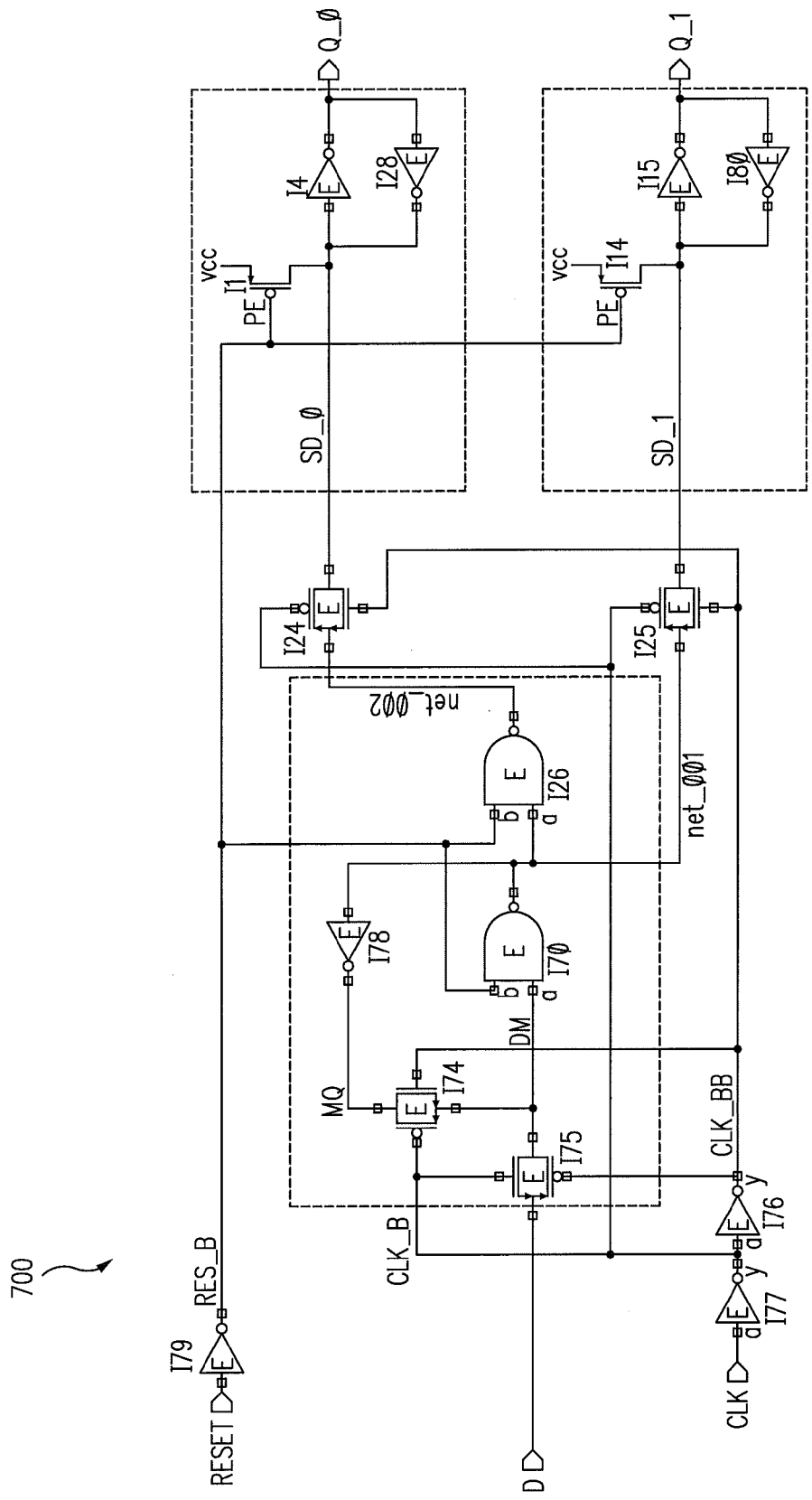
FIG. 7 shows a block diagram illustrating an exemplary circuit implementation for a portion of the memory of FIG. 6 in accordance with an embodiment of the present invention.
Figure 8:
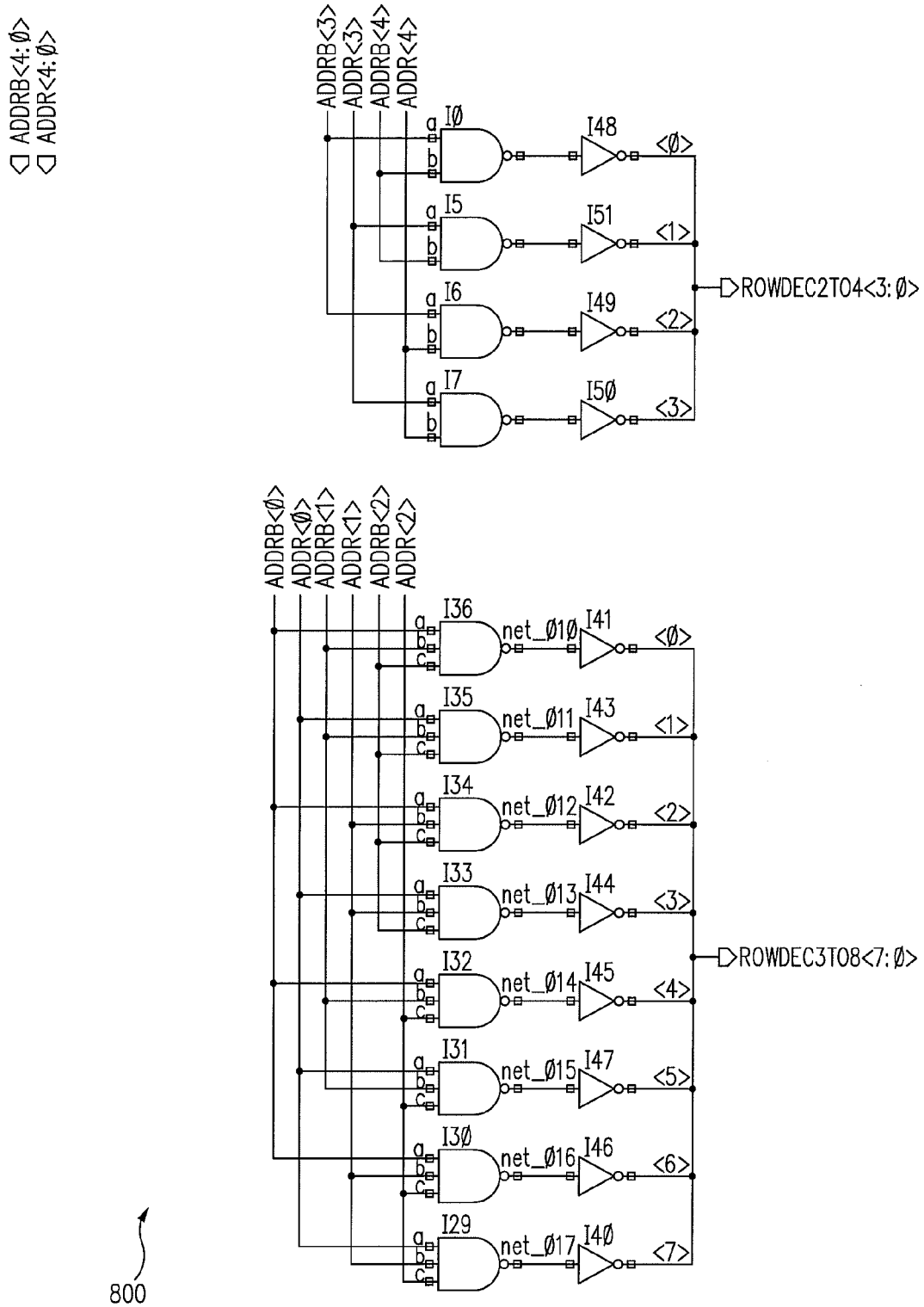
FIG. 8 shows a block diagram illustrating an exemplary circuit implementation for a portion of the memory of FIG. 6 in accordance with an embodiment of the present invention.
Figure 9:
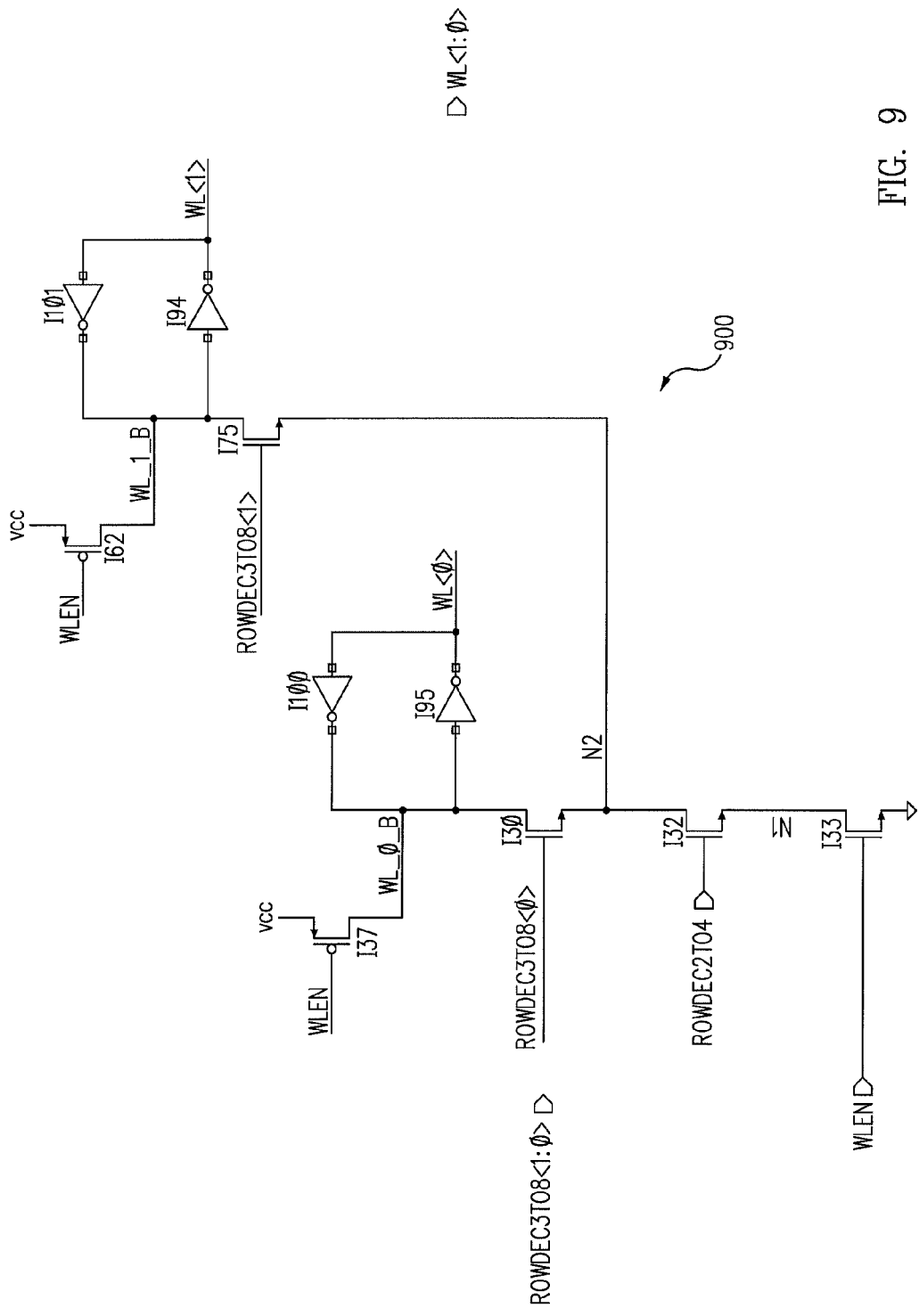
FIG. 9 shows a block diagram illustrating an exemplary circuit implementation for a portion of the memory of FIG. 6 in accordance with an embodiment of the present invention.

FIGS. 7-9 show exemplary circuit implementations for portions of memory 600 (FIG. 6). Specifically, FIG. 7 shows a circuit 700, which is an exemplary circuit implementation for one of the registers within address registers 602 of memory 660 in accordance with an embodiment of the present invention. FIG. 8 shows a circuit 800, which is an exemplary circuit implementation for address pre-decoder 604 of memory 600 in accordance with an embodiment of the present invention. FIG. 9 shows a circuit 900, which is an exemplary circuit implementation for some of the drivers (e.g., wordline drivers providing WORDLINE<1:0> or referred to as WL<1> and WL<0>) within wordline drivers 606 in accordance with an embodiment of the present invention.

Circuit 700 (FIG. 7) shows an exemplary address register receiving the reset signal, the clock signal, and one of the bits (labeled D) of the address signal (e.g., a five-bit address signal labeled ADDRESS<4:0>). The reset signal, for this exemplary implementation, may be asserted asynchronously to the clock signal, but generally should only be deasserted when the clock signal is low in order to avoid erroneously triggering a data 0 output signal from circuit 700. It should be understood that this implementation is not limiting and that other exemplary circuit implementations may be utilized in accordance with one or more embodiments of the present invention as would be understood by one skilled in the art.

Circuit 700 provides the registered address signal (e.g., one bit of the registered address signal labeled Q_0 and Q_1 in FIG. 7) based upon the value of the address signal (e.g., the bit signal labeled D) and upon the value of the reset signal. For example, if the address signal is at a logical zero value (i.e., data 0 for the D bit signal), then circuit 700 will provide the registered address signal having a logical one value and a logical zero value for the Q_0 and Q_1 signals (i.e., signals Q_0 and Q_1 equal 1 and 0, respectively). If the address signal is at a logical one value (i.e., data 1 for the D bit signal), then circuit 700 will provide the registered address signal having a logical zero value and a logical one value for the Q_0 and Q_1 signals (i.e., signals Q_0 and Q_1 equal 0 and 1, respectively). However, if the reset signal is asserted (e.g., no data), then for this exemplary implementation circuit 700 will provide the registered address signal having a logical zero value for the Q_0 and Q_1 signals (i.e., signals Q_0 and Q_1 both equal 0).

Figure 10:
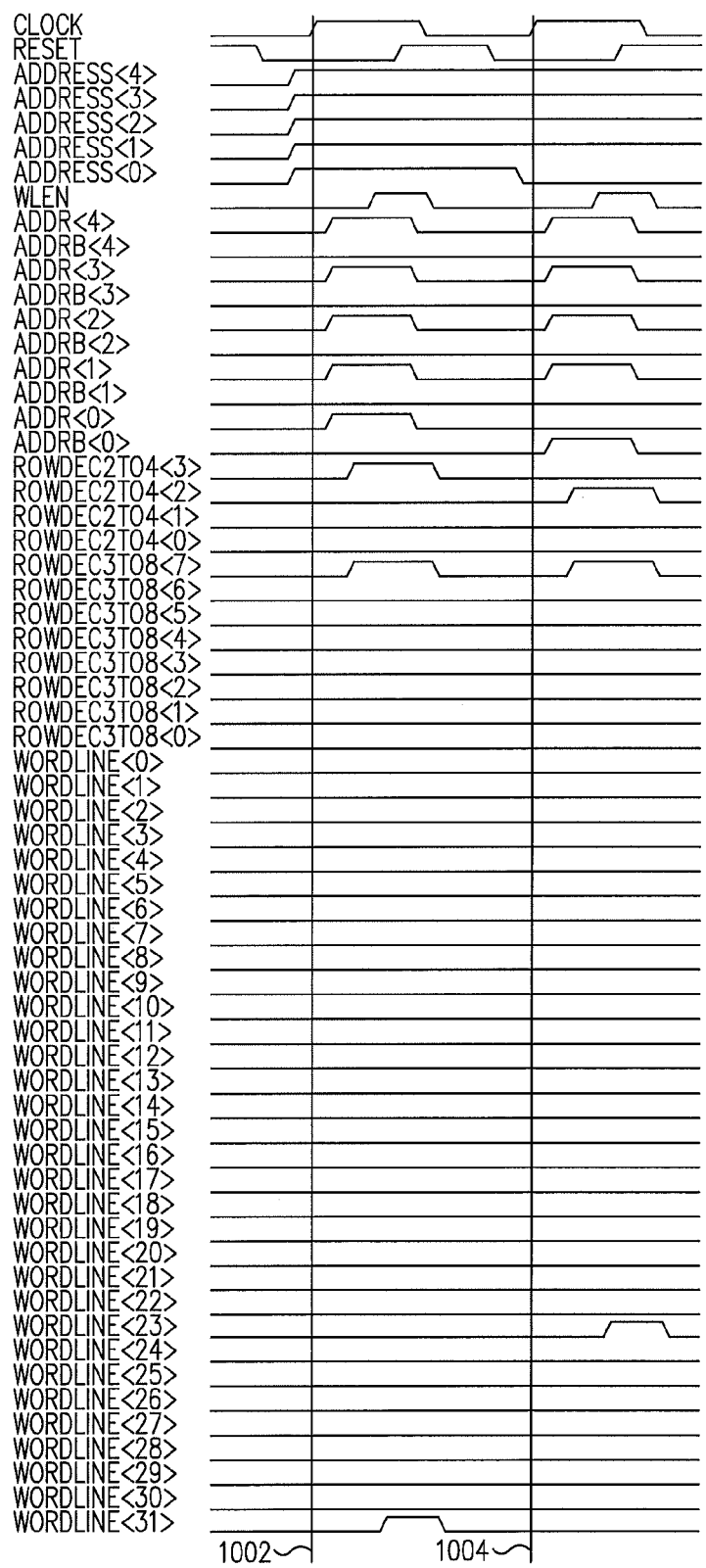
FIG. 10 shows a timing diagram illustrating an exemplary timing scenario for the memory of FIG. 6 in accordance with an embodiment of the present invention.

FIG. 10 shows a timing diagram illustrating an exemplary timing scenario for memory 600 of FIG. 6 in accordance with an embodiment of the present invention. As shown in FIG. 10, a new address (as shown by ADDRESS<4:0>) is provided to address registers 602 prior to a rising edge of the clock signal (at vertical line 1002). The new address is clocked into address registers 602 and propagated through address pre-decoder 604 to wordline drivers 606, as shown in FIG. 10 (e.g., signals ADDR<4:0> and ADDRB<4:0> and ROWDEC2TO4<3:0> and ROWDEC3TO8<7:0>).

When or after the wordline enable (WLEN) signal is asserted, the appropriate wordline (e.g., WORDLINE<31>) is asserted. The wordline enable (WLEN) signal is then deasserted to end the cycle and start the pre-charge of the bitlines for the next cycle (e.g., around a vertical line 1004).

After the wordline enable (WLEN) signal is asserted, the reset signal is also asserted to reset address registers 602 (e.g., signals ADDR<4:0> and ADDRB<4:0> are forced low), which results in the output signals from address pre-decoder 604 being reset also (e.g., signals ROWDEC2TO4<3:0> AND ROWDEC3TO8<7:0> are forced low). Consequently, if a new address is slow to propagate through address pre-decoder 604, then the result is a delay in the activation of the appropriate wordline rather than the erroneous assertion of one or more wordlines as illustrated for a conventional address decoder (e.g., in reference to FIG. 5).

Figure 11:
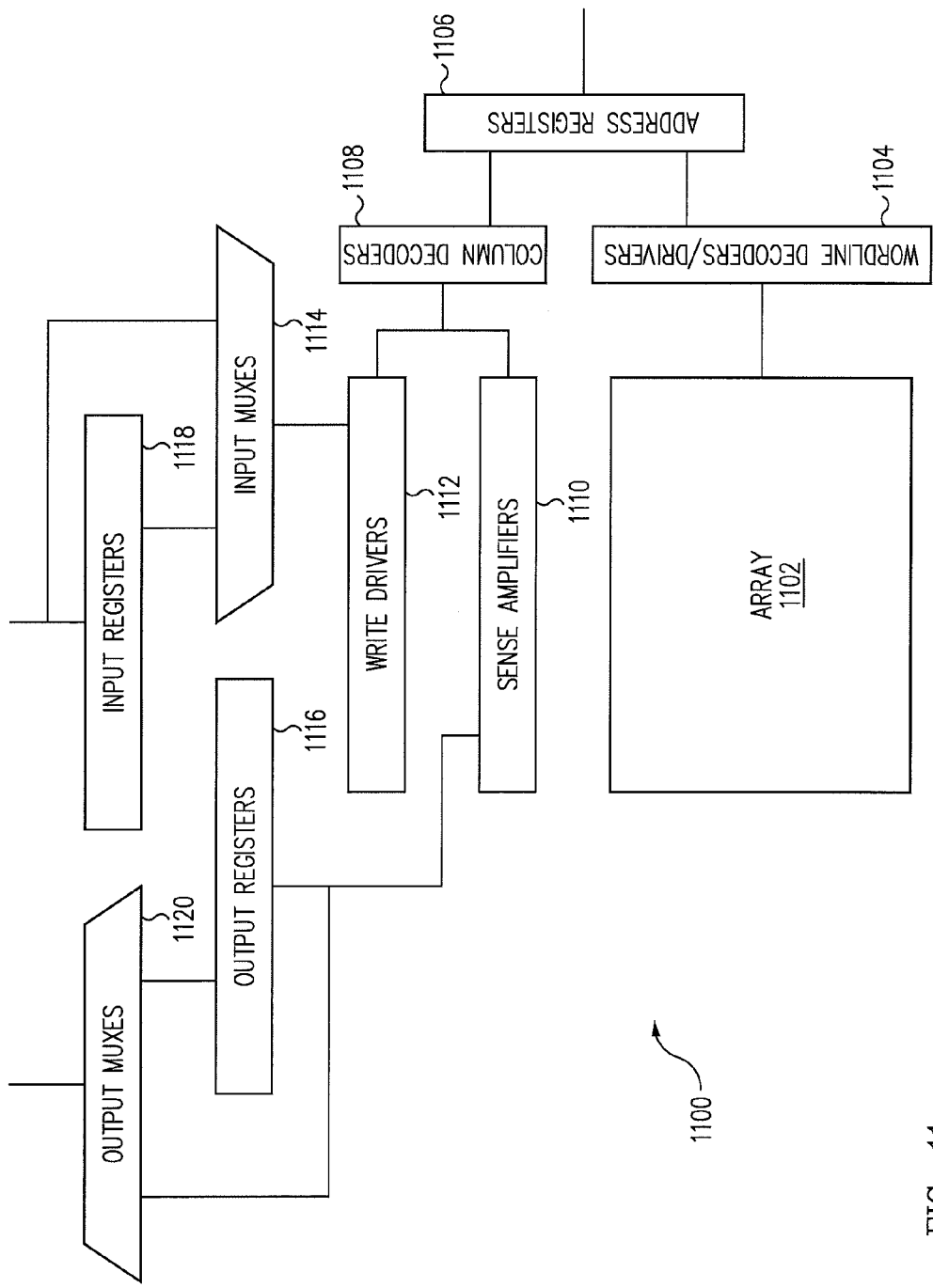
FIG. 11 shows a block diagram illustrating an exemplary memory in accordance with an embodiment of the present invention.

FIG. 11 shows a block diagram illustrating an exemplary circuit 1100 in accordance with an embodiment of the present invention. Circuit 1100 represents, for example, an exemplary memory (e.g., within a programmable logic device), which may incorporate one or more techniques disclosed herein. In general, circuit 1100 includes a memory array 1102, wordline decoders/drivers 1104, address registers 1106, column decoders 1108, sense amplifiers 1110, write drivers 1112, input multiplexers 1114, output registers 1116, input registers 1118, and output multiplexers 1120.

As an example, the techniques disclosed in reference to FIGS. 6-10 may be applied to wordline decoders/drivers 1104 and address registers 1106. Specifically, the techniques disclosed in reference to FIGS. 6 and 7 may be applied to address registers 1106, while the techniques disclosed in reference to FIGS. 6, 8, and 9 may be applied to wordline decoders/drivers 1104. Thus, for example, the techniques disclosed herein may be applied to a conventional memory or to other types of applications to provide higher performance and/or greater reliability.

Systems and methods are disclosed herein to provide improved memory techniques. For example, in accordance with an embodiment of the present invention, a memory is disclosed that employs a dual rail address decoding scheme. Consequently, after an appropriate wordline is activated, the input signals to the address pre-decoder (e.g., address pre-decoder 604) can be cleared such that its output signals are not asserted (e.g., none are set high). Therefore, the potential problem of an old address violating the setup time for the next assertion of the wordline enable (WLEN) signal is eliminated.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   an address register adapted to receive a reset signal, a clock signal, and an address signal and provide a registered address signal, wherein the registered address signal provides at least a true and a complement signal, with the true and complement signal set to approximately the same logical value upon assertion of the reset signal;
   an address pre-decoder, coupled to the address register, adapted to partially decode the registered address signal to provide a pre-decoded output signal; and
   a wordline driver, coupled to the address pre-decoder, adapted to receive a wordline enable signal and the pre-decoded output signal and provide a wordline signal based on the pre-decoded output signal upon assertion of the wordline enable signal.

2. The integrated circuit of claim 1, further comprising a memory array adapted to receive the wordline signal from the wordline driver.

3. The integrated circuit of claim 1, wherein the pre-decoded output signal is set to approximately the same logical value upon assertion of the reset signal.

4. The integrated circuit of claim 1, wherein the reset signal is asserted for a period of time after each assertion of the wordline enable signal.

5. The integrated circuit of claim 1, wherein the address register, the address pre-decoder, and the wordline driver form an address decoder for a memory block, wherein the integrated circuit further comprises a plurality of the memory blocks having corresponding address decoders.

6. The integrated circuit of claim 1, wherein the registered address signal is a dual rail signal.

7. The integrated circuit of claim 1, wherein the integrated circuit is at least one of a programmable logic device and a memory.

8. An integrated circuit comprising:
   means for receiving an address signal and providing a registered address signal, wherein the registered address signal is a dual rail signal;
   means for decoding the registered address signal;
   a memory array; and
   means for activating a wordline within the memory array based on the decoding of the registered address signal, wherein the registered address signal is reset after each activation of a wordline within the memory, with all of the bits of the registered address signal set to approximately the same logical value.

9. The integrated circuit of claim 8, wherein the receiving and providing means provides the registered address signal having true and complement signals or, upon assertion of a control signal, provides approximately the same logical value for the true and complement signals of the registered address signal.

10. The integrated circuit of claim 8, wherein the wordline is activated by the activating means upon assertion of a wordline enable signal.

11. The integrated circuit of claim 8, wherein the integrated circuit is a programmable logic device.

12. The integrated circuit of claim 8, wherein the receiving and providing means, the decoding means, the memory array, and the activating means comprises a memory within the integrated circuit, and wherein the integrated circuit further comprises a plurality of the memory.

13. A method of activating a wordline for a memory, the method comprising:
- receiving an address signal;
- providing a dual rail address signal based on the address signal;
- decoding the dual rail address signal;
- activating a wordline within the memory based on the decoding of the dual rail address signal; and
- receiving a reset signal, wherein the dual rail address signal comprises true and complement signals based on the address signal, with the true and complement signals set to approximately the same logical value upon assertion of the reset signal.

14. The method of claim 13, further comprising registering the address signal.

15. The method of claim 13, further comprising receiving a wordline enable signal, wherein the activating of the wordline occurs upon assertion of the wordline enable signal.

16. The method of claim 13, further comprising:
- receiving a wordline enable signal, wherein the activating of the wordline occurs upon assertion of the wordline enable signal; and
- wherein the reset signal is asserted after each assertion of the wordline enable signal to set all of the bits of the dual rail address signal to approximately the same logical value.

17. The method of claim 13, wherein the memory is incorporated within a programmable logic device.

18. The method of claim 13, wherein the decoding of the dual rail address signal provides a deasserted signal upon assertion of the reset signal.

* * * * *